(12) United States Patent
Han et al.

(10) Patent No.: US 7,341,910 B2
(45) Date of Patent: Mar. 11, 2008

(54) METHOD FOR FORMING A FLASH MEMORY BY USING A MICROCRYSTALLINE POLYSILICON LAYER AS A FLOATING GATE

(75) Inventors: Tzung-Ting Han, I-Lan (TW); Chin-Ta Su, Yunlin (TW); Yun-Chi Yang, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 371 days.

(21) Appl. No.: 10/192,565

(22) Filed: Jul. 11, 2002

(65) Prior Publication Data

US 2004/0009651 A1 Jan. 15, 2004

(51) Int. Cl.
*H01L 21/336* (2006.01)

(52) U.S. Cl. .................................. 438/257; 438/488
(58) Field of Classification Search ............... 438/237, 438/260, 266, 257, 488
See application file for complete search history.

(56) References Cited

U.S. PATENT DOCUMENTS 6,465,308 B1* 10/2002 Cheng et al. ............... 438/289
2003/0047734 A1* 3/2003 Fu et al. ........................ 257/64

* cited by examiner

*Primary Examiner*—Jack Chen

(57) ABSTRACT

This invention provides a method for forming a microcrystalline polysilicon layer by using silane or dislane with introducing hydrogen gas. This microcrystalline polysilicon layer can be used as a floating gate of a flash memory to improve the character of the flash memory.

6 Claims, 6 Drawing Sheets

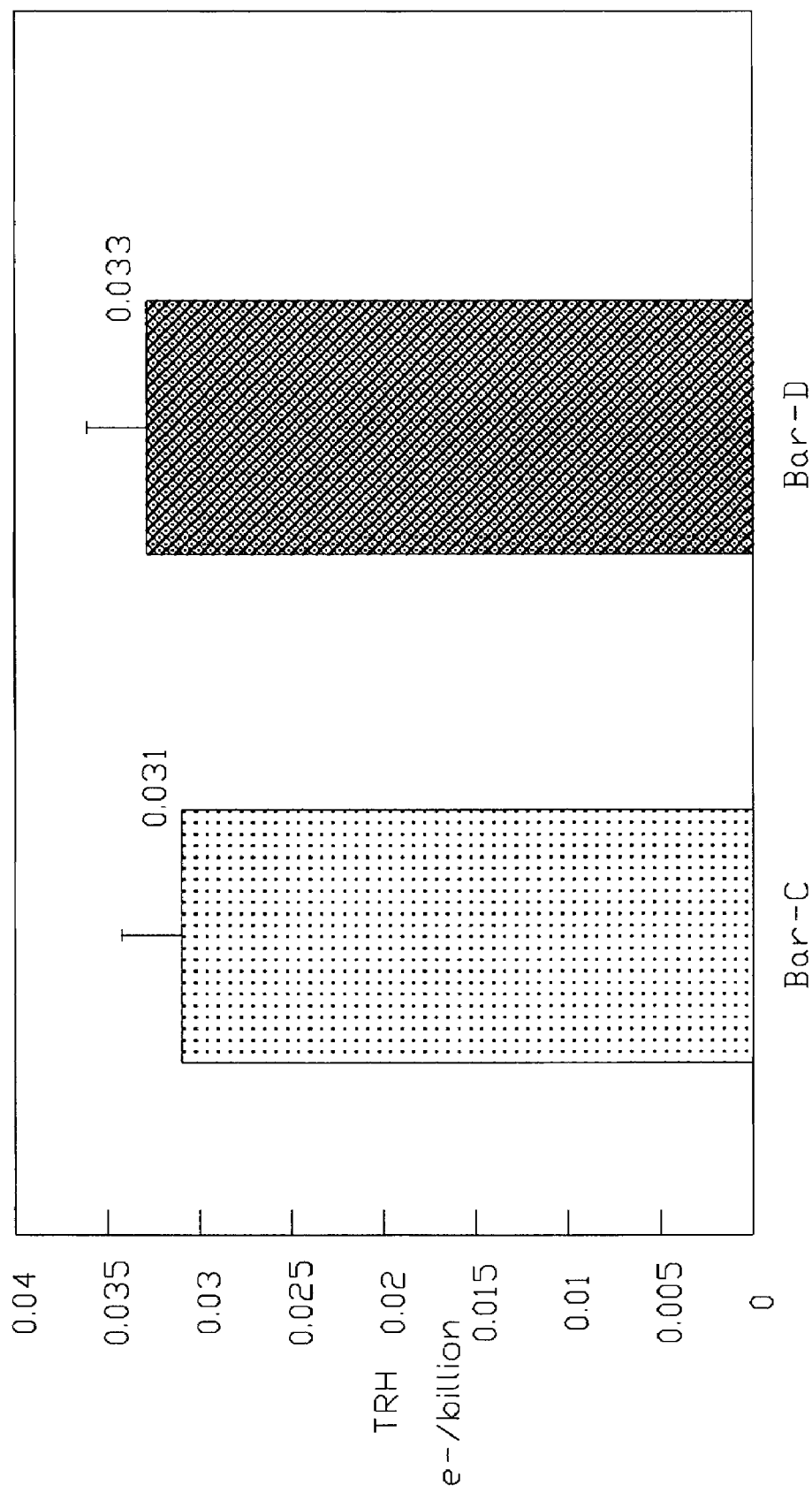

METHOD FOR FORMING A FLASH MEMORY BY USING A MICROCRYSTALLINE POLYSILICON LAYER AS A FLOATING GATE

BACKGROUND OF THE INVENTION

1. Field of the Invention

The present invention relates generally to a flash memory and in particular the present invention relates to using a microcrystalline polysilicon film as a floating gate to improve the performance of a flash memory cell.

2. Description of the Prior Art

A typical flash memory comprises a memory array, which includes a large number of memory cells arranged in row and column fashion. Each of the memory cells includes a floating gate field-effect transistor capable of holding charges. The memory cells are usually grouped into blocks. Each of the cells within a block can be electrically programmed in a random basis by charging the floating gate. The charges can be removed from the floating gate by a block erasure operation. The presence or absence of the charges in the floating gate determines the data in a cell.

FIG. 1 is a cross-sectional view of a typical memory cell 5, such as used in a flash memory. The memory cell 5 comprises a region of a source 60 and a region of a drain 70. The source 60 and drain 70 are separated by a predetermined space of a channel region 80. The memory cell 5 further includes a floating gate 30 formed by a first polysilicon layer and a control gate 50 formed by a second polysilicon layer. The floating gate 30 is isolated from the control gate 50 by an interpoly dielectric layer 40 and from the channel region 80 by a thin oxide layer (a tunnel oxide layer) 20 with approximately 100 angstroms thick.

FIG. 2 shows a magnified cross-sectional view of a floating gate of a polysilicon layer 84 formed on a thin oxide layer 82 such as a tunnel oxide. The polysilicon layer 84 is formed by depositing silicon onto the surface of the thin oxide layer 82 in a low pressure chemical vapor deposition (LPCVD) chamber at a temperature of approximately 600° C. by using silane (SiH$_4$) as reaction gas. The grain size of the polysilicon layer is about 1000 angstrom to about 2000 angstrom. The surface roughness of the polysilicon layer 84 is a result of the large-grained columnar crystal structures within the film. This pronounced surface roughness makes it difficult to obtain good patterning profiles due to the significant variation in inter granular thickness of a photoresist layer formed on the surface of the polysilicon layer 84 and the non-uniformity in reflectivity which occurs during the photolithographic process. The non-uniformity in reflectivity of the photoresist layer causes bad etching profiles, and resulting in the polysilicon stringer issue.

FIG. 3 shows a magnified cross-sectional view of another floating gate of a polysilicon layer 88 formed on a thin oxide layer 86 such as a tunnel oxide. The polysilicon layer 88 is formed by a process in which silicon is deposited on the surface of the thin oxide layer in a LPCVD chamber at a temperature of approximately 550° C. By depositing silicon at this lower temperature, amorphous silicon is created because crystal grains cannot develop at this low temperature. This amorphous silicon is subsequently recrystallized by being exposed under a temperature in excess of 600° C. The result is the polycrystalline structure of a polysilicon layer 88 shown in FIG. 3, wherein large crystal grains are formed. While the polysilicon layer 88 of FIG. 3 overcomes the problems associated with surface roughness of FIG. 2 described above. The large grain size of the polysilicon layer 88 reduces the grain boundary density of the film. In addition, because the polysilicon layer 88 is deposited at a low temperature, the deposition rate is quite low, resulting in slow throughput times.

The charge storage or erasure of the flash memory cell 5 as shown in FIG. 1 is programmed by Fowler-Nordheim tunneling of electrons through the thin tunnel oxide layer 20 between the floating gate 30 and the channel region 80. The thin tunnel oxide layer 20 generally is about 100 angstroms. In the programming mode for the flash memory cell 5, hot carriers tunnel from the channel region 80 to the floating gate 30 and are stored in the floating gate 30. The control gate 50 and the drain 70 of the flash memory cell 5 are positively biased while the source 60 is grounded. In the erasure mode, usually programmed, the drain 70 is biased at a high voltage to finish the erasure process.

An over erased memory cell has a faster erasure speed, which means a higher electron current through the thin tunneling oxide layer 20. When using a floating gate formed of large-grained polysilicon causes wider threshold voltage (Vt) distribution. If over erased blocks exist, threshold voltage distribution after erasure has tail components and larger variance values. In other words, the wider threshold voltage distribution corresponds to large polysilicon grains.

In the conventional process for fabricating a flash memory, by using a large-grained polysilicon film as a floating gate. There are many drawbacks such as over erasing, wider threshold voltage distribution, tail bit issue, tunnel oxide quality down, higher polysilicon resistance and bad etching profile due to the polysilicon stringer issue.

SUMMARY OF THE INVENTION

In accordance with the present invention, it is a main object of this invention to form a flash memory cell as described, which uses a film of microcrystalline polysilicon as a floating gate.

It is another object of this invention to form a flash memory cell with a microcrystalline polysilicon floating gate to improve the wider threshold voltage distribution and tail bit issue of the memory cell.

It is a further object of this invention to form a flash memory cell with a microcrystalline polysilicon floating gate to improve the over erasure issue of the memory cell.

It is still a further object of this invention to form a flash memory cell with a microcrystalline polysilicon floating gate to improve the quality of the tunnel oxide layer of the memory cell.

It is still a further object of this invention to form a flash memory cell with a microcrystalline polysilicon floating gate to improve the reliability of the flash memory.

It is still a further object of this invention to form a flash memory cell with a microcrystalline polysilicon floating gate to improve the etching profile of the floating gate.

It is still a further object of this invention to form a flash memory cell with a microcrystalline polysilicon floating gate to reduce the resistance of the floating gate.

The present invention provides a memory cell by using a microcrystalline polysilicon layer as a floating gate. The lower electron affinity is the characteristic, which is utilized in the flash memory, and is accentuated, in microcrystalline samples that have an even lower electron affinity. The use of a lower electron affinity material for the floating gate serves to reduce the barrier at the interface with the tunneling gate oxide and the tunneling distance, and greatly increase the tunneling probability.

The solution to these problems is to use a floating gate having a lower electron affinity for electrons. Thus, a lower barrier is provided for electrons to escape over, or through by tunneling. Lower barriers require lower voltages as a result of smaller tunneling distances for the electrons during the erasure operation. This results in much faster erasure times and considerably less damage.

In this invention, by using a microcrystalline polysilicon layer as a floating gate to improve the performance of the flash memory. The method provides a substrate wherein the substrate comprising a source region and drain region is separated by a channel region. A tunnel oxide layer is formed on the substrate. A microcrystalline polysilicon layer as a floating gate is formed on the tunnel oxide layer. The method used to form the microcrystalline polysilicon layer is a low-pressure chemical vapor deposition. The reaction gas is selected from silane and disilane then by adjusting the concentration of hydrogen gas introducing to the chamber. An interpoly dielectric layer is formed on the microcrystalline polysilicon layer. A polysilicon layer as a control gate is formed on the interpoly dielectric layer. Then, the polysilicon layer, the interpoly dielectric layer, the microcrystalline polysilicon layer and the tunnel oxide layer are etched to form the gate of the memory cell.

BRIEF DESCRIPTION OF THE DRAWINGS

FIG. 8 is a diagram showing electric trapping rate (TRH) of a tunnel oxide layer with the microcrystalline polysilicon film and the polysilicon film as a floating gate, respectively.

DESCRIPTION OF THE PREFERRED EMBODIMENT

The present invention will be described in detail with reference to the accompanying drawings. The embodiment provides a method for improving the performance of the flash memory by using a microcrystalline polysilicon film as a floating gate.

Figure 4:
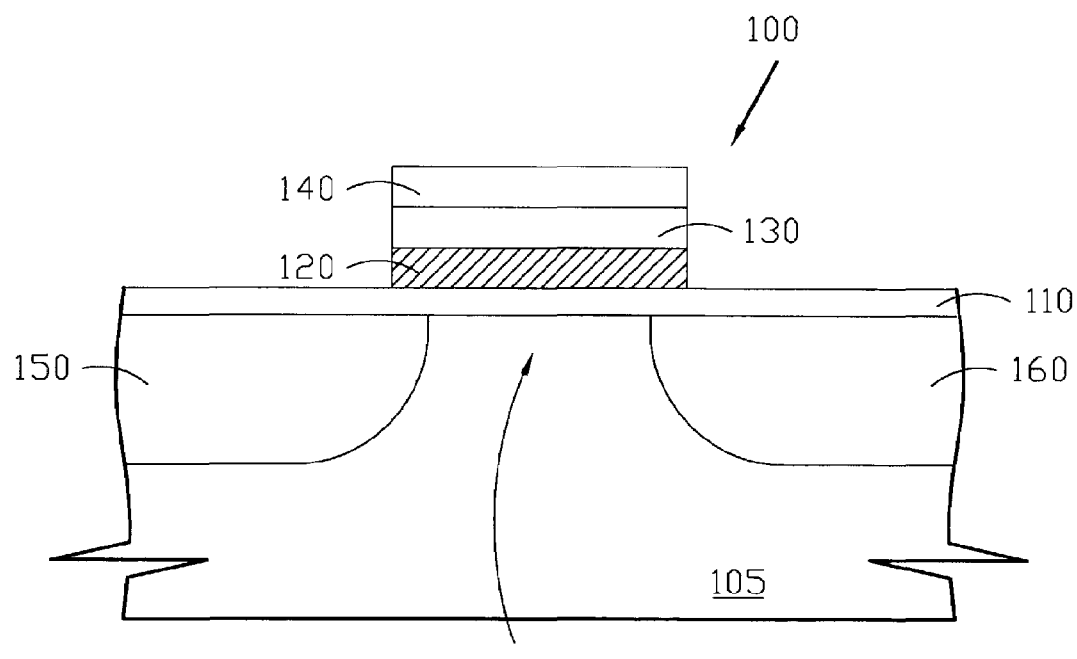
FIG. 4 is a cross-sectional view of a memory cell incorporating a microcrystalline polysilicon layer as a floating gate.

FIG. 4 shows a cross-sectional view of a memory cell 100 where the normal polysilicon layer as a floating gate 120 has been replaced by a thin microcrystalline polysilicon layer 120. A source 150 and drain 160 are separated by a predetermined space of a channel region 170. The memory cell 100 further includes a floating gate 120 formed of a microcrystalline polysilicon layer. A polysilicon layer 140 forms a control gate 140. The floating gate 120 is isolated from the control gate 140 by an interpoly dielectric layer 130 such as an ONO (oxide-nitride-oxide) layer and from the channel region 170 by a gate dielectric layer 110 such as a silicon oxide layer. The interpoly dielectric layer 130 and the gate dielectric layer 110 are insulating layers. The gate dielectric layer 110 serves as a tunnel oxide layer.

Figure 5:
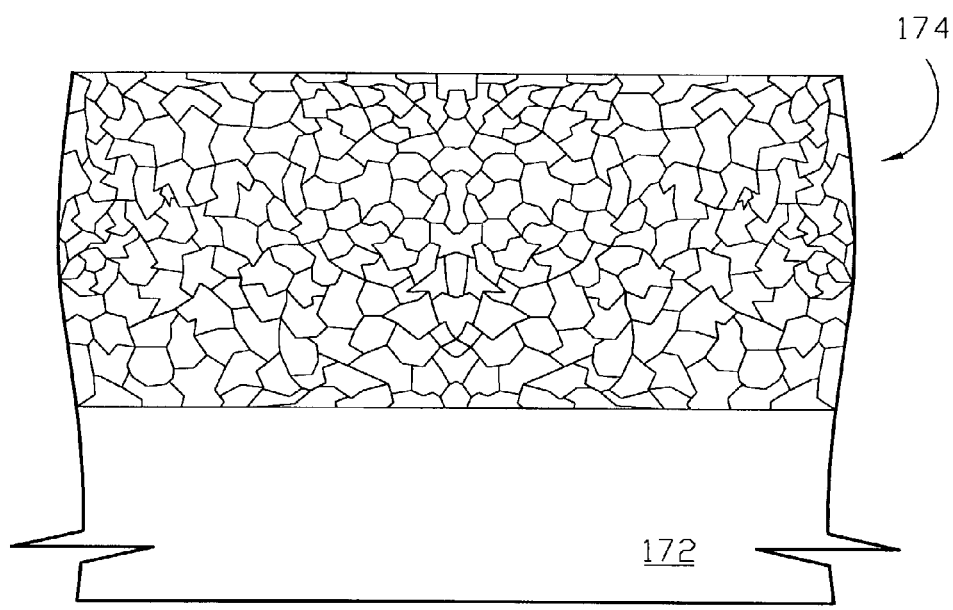
FIG. 5 is a magnified cross-sectional view of a microcrystalline polysilicon film as a floating gate formed on a tunnel oxide layer.

FIG. 5 shows a magnified cross-sectional view of a floating gate film formed in accordance with the present invention. A microcrystalline polysilicon film 174 is formed on a tunnel oxide layer 172. The size of the microcrystal grains within the microcrystalline polysilicon film 174 is controlled by adjusting the ratio of hydrogen to silicon in the reactant gas mixture of the deposition chamber in which the film is formed. The reactant gas mixture of this embodiment is composed of silane ($SiH_4$) and introducing hydrogen gas. The reactant gas mixture of another embodiment composes of disilane ($Si_2H_6$) and introducing hydrogen gas. The average size of the microcrystal grains within the microcrystalline polysilicon[microsilicon] film 174 is within the range of approximately 500 angstroms to 1000 angstroms. The size of a grain within the microcrystalline polysilicon film 174 is defined as the average diameter of the grain.

Although the particles may not be formed as a uniform sphere, they can be described as having a general diameter of approximately 500 to 1000 angstroms. The low pressure chemical vapor deposition (LPCVD) method or other enhanced CVD techniques known to those skilled in the art can deposit these films. The reaction parameters of the LPCVD method of this embodiment are described as follows: the pressure is about 200~400 torr, the temperature is about 700~750° C., the gas flow ratio of hydrogen gas: hydrogen gas and nitrogen gas is about 5~60% (i.e. 5~60% hydrogen gas/100% (hydrogen gas and nitrogen gas)). The floating gate can be patterned and etched using standard techniques similar to those used to form the polysilicon floating gates in conventional devices.

The main decomposition reaction is $SiH_4 \leftrightarrow Si_2+2H_2$. In conventional polysilicon films, the high surface diffusion rate of silicon atoms prevails over the nucleation rate, resulting in large grain size and growth rate. In this embodiment by adjusting the concentration of hydrogen gas, the microcrystalline polysilicon exhibits a slower diffusion rate, resulting in a slower grain growth rate, but does not affect the nucleation rate. Consequently, the nucleation rate prevails over the diffusion rate and results in small grain size.

Figure 1:
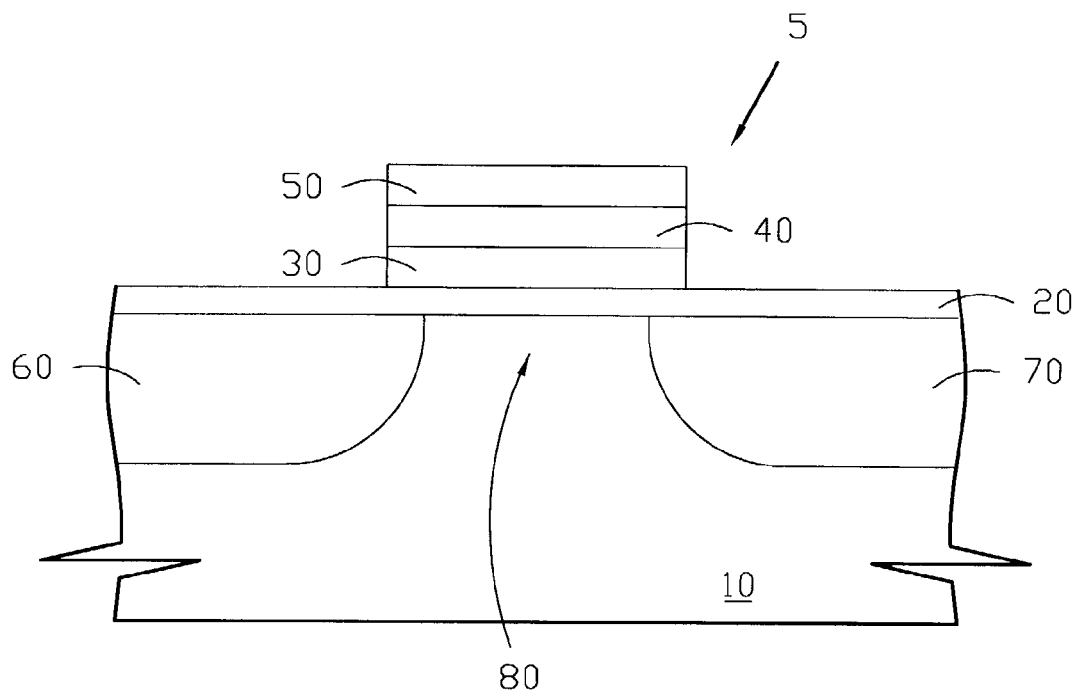
FIG. 1 is a cross-sectional view of a prior art memory cell.
Figure 2:
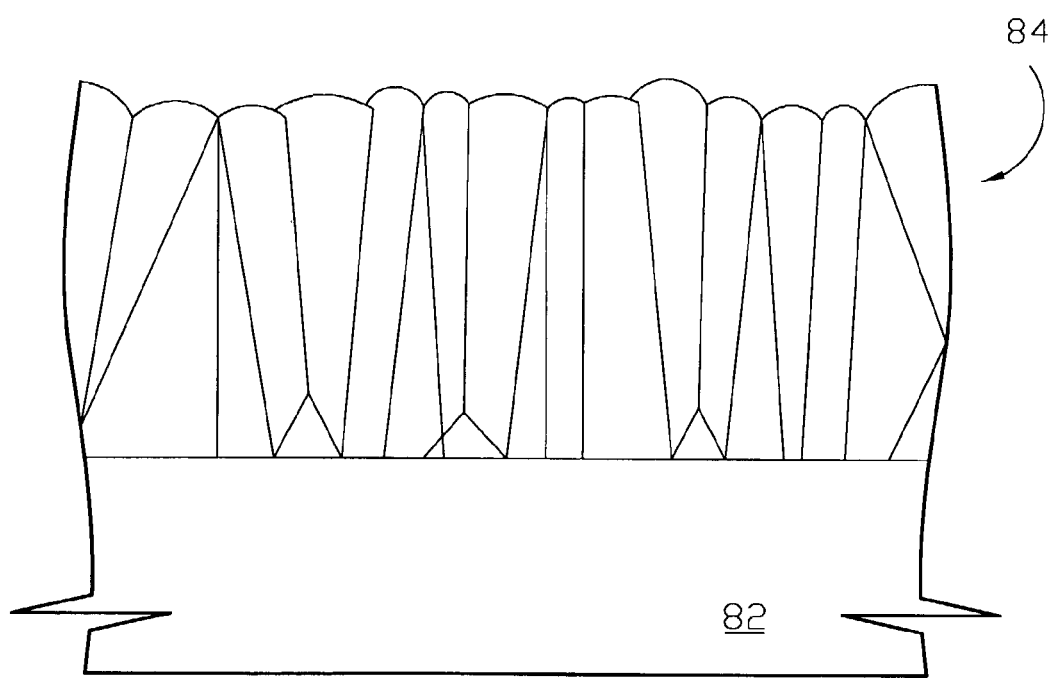
FIG. 2 is a magnified cross-sectional view of a polysilicon film as a floating gate formed on a substrate.
Figure 3:
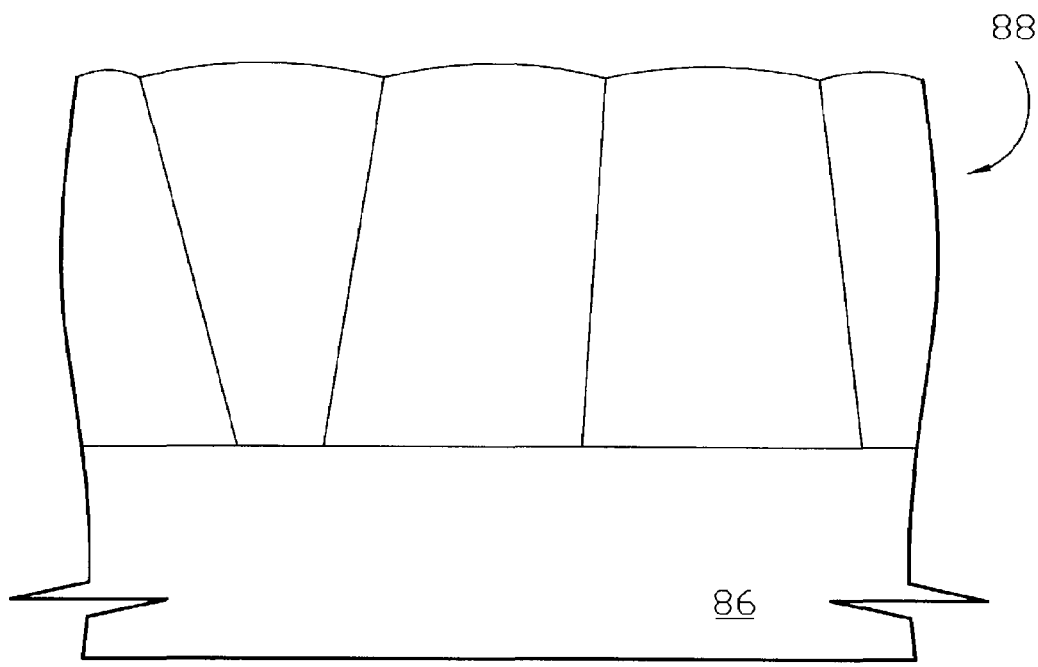
FIG. 3 is a magnified cross-sectional view of a recrystallized polysilicon film as a floating gate formed on a thin oxide layer.

As shown in FIG. 5, the grain boundary density of the microcrystalline polysilicon film 174 is greatly increased as a result of the significant reduction in the grain size of the microcrystalline polysilicon film 174 as compared to the large columnar grains of FIG. 2, or FIG. 3. As previously discussed, doping species used to dope a polysilicon film primarily diffuses through the polysilicon film along grain boundaries. Because the grain boundary density of the microcrystalline polysilicon film 174 is significantly greater than, for example, the grain boundary density of the polysilicon film 84 of FIG. 2, the diffusion of doping species through the structure of the microcrystalline polysilicon film 174 is much improved. Dopants introduced near the surface of the microcrystalline polysilicon film 174 can readily diffuse along the high density of grain boundaries throughout the microcrystalline polysilicon film 174. As a result, the doping concentrations throughout the microcrystalline polysilicon film 174 and hence the conductivity of the microcrystalline polysilicon film 174 provide uniform electric field as compared to the recrystallized amorphous polysilicon film 88 of FIG. 3.

In addition to the reduction of the average grain size of the microcrystalline polysilicon film 174, the surface of the microcrystalline polysilicon film 174 exhibits a much more planar surface than that achieved by the conventional polysilicon film 84 of FIG. 2. Minimization in the grain size of the microcrystalline polysilicon film 174 formed in accordance with the present invention has been observed to have a smoothing affect on the surface of the film. In other words, as the parameters of forming the microcrystalline polysilicon film 174 are adjusted to increase or decrease the average grain size of the film, the surface roughness of the film is similarly increased or decreased respectively. By smoothing the surface of the microcrystalline polysilicon film 174, a variation in inter granular thickness is reduced while the reflectivity of the film during the photolithography process is more uniform as compared to the conventional polysilicon film 84 of FIG. 2. As a result, the microcrystalline polysilicon film 174 exhibits improved edge definition, resulting in improved performance of the memory cell.

Figure 6A:
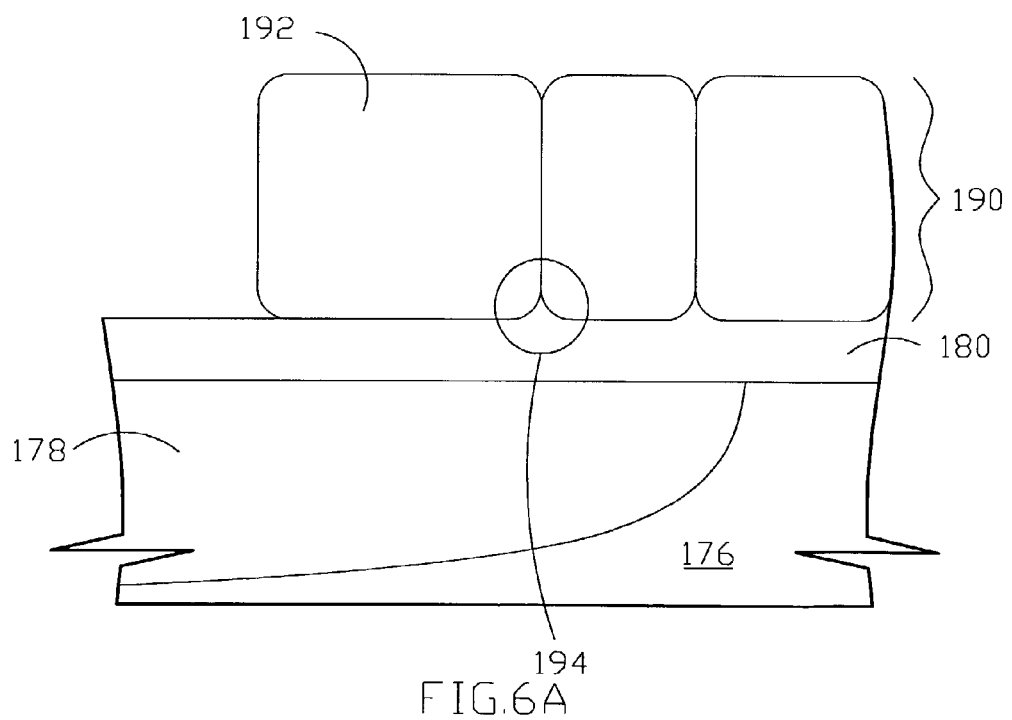
FIG. 6A is a schematic diagram showing a small number of large oxide valley formed in one memory cell.
Figure 6B:
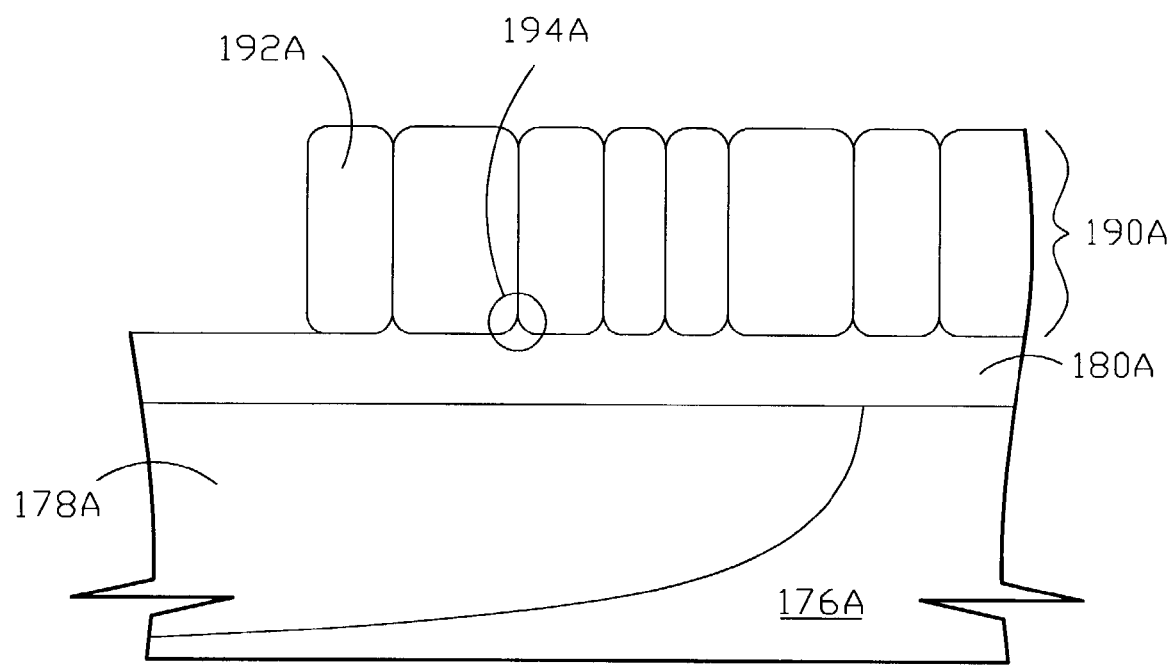
FIG. 6B is a schematic diagram showing a large number of small oxide valley formed in one memory cell.

These results as shown in FIGS. 6A and 6B can be explained assuming the existence of "oxide valleys" 194 and 194A in the tunnel oxide layer 180 and 180A. In the conventional process, a high phosphorous doped silicon oxide ($SiO_2$) region, which is designated as an oxide valley 194 is formed under the boundary of the polysilicon grain 192. The amount of polysilicon grains 192 corresponds to the total length of the oxide valley 194. Using the large grain size for the polysilicon grains 192, a few numbers of the polysilicon grains 192 exist in the erasure area. For example, in the case of five polysilicon grains 192 existing in the erasure area, each polysilicon grain 192 has 20% erasure action. Therefore, one polysilicon grain 192 results in a large difference in erasure speed and a wider erasure threshold voltage distribution is caused.

Next, in this embodiment as shown in FIG. 6B, a large number of oxide valley 194A can create an ideal situation such that every memory cell in the cell array has the same erasure speed. On the other hand, using a small grain size in the microcrystalline polysilicon 190A, a lot of grains 192A exist in each erasure area. For example, in the case of fifty microcrystalline polysilicon grains 192A exist in the erasure area, one microcrystalline polysilicon grain 192A has only 2% erasure action. Therefore, each cell has a similar erasure] speed, which realizes a narrow erasure threshold voltage distribution. A large erasure area shows a narrow erasure threshold voltage distribution. A large erasure area can contain a larger number of polysilicon grains 192A. This leads to an uniform erasure speed and a narrow erasure threshold voltage distribution.

The gate voltage directly determines the magnitude of gate current and the gate current (or the injected charge) has a major effect on the process of dielectric degradation leading to breakdown. In this embodiment, the charge-to-breakdown (Qbd) and trapping rate (TRH) of the tunnel oxide layer are measured by using the microcrystalline polysilicon film and the polysilicon film as a floating gate. TAB. 1 shows data of the tunnel oxide layer about a thick, a charges-to-breakdown and an electric trapping rate with the microcrystalline polysilicon film and the polysilicon film as a floating gate, respectively. As shown in TAB. 1, the thicknesses of the microcrystalline polysilicon floating gate and the polysilicon floating gate are the same whether measured by a CV method or a FV method. Each data is an average of three data measured from a wafer.

Figure 7:
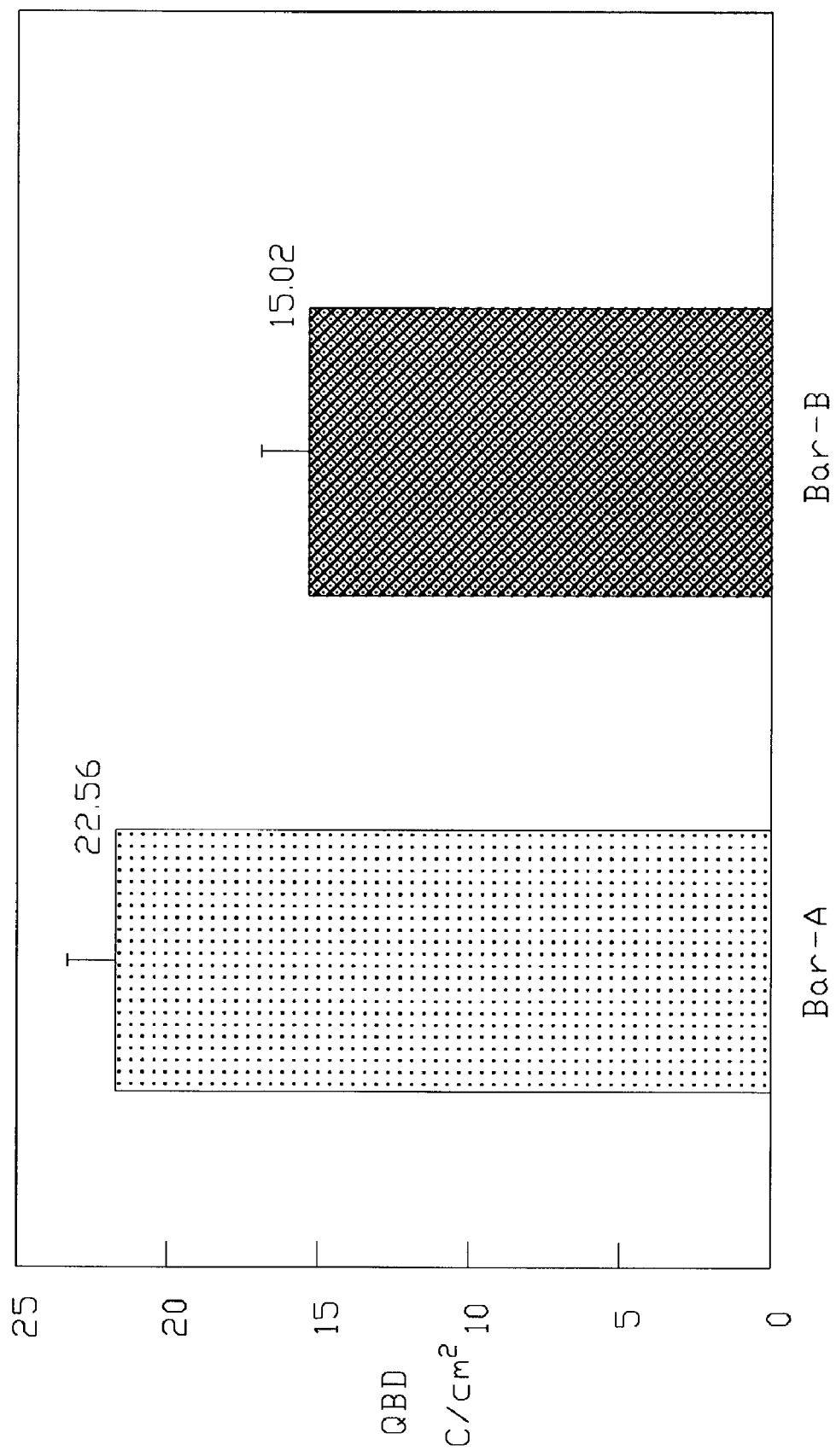
FIG. 7 is a diagram showing charge-to-breakdown (Qbd) of a tunnel oxide layer with the microcrystalline polysilicon film and the polysilicon film as a floating gate, respectively.

As shown in FIG. 7, bar-A is using a microcrystalline polysilicon film as a floating gate. Bar-B is using a polysilicon film as a floating gate. In this present invention, a tunnel oxide layer with the microcrystalline polysilicon film as a floating gate have a higher electron injection efficiency and a larger charge-to-breakdown voltage.

In addition, as shown in FIG. 8, bar-C is using a microcrystalline polysilicon film as a floating gate. Bar-D is using polysilicon film as a floating gate. The tunnel oxide layer with the microcrystalline polysilicon film as a floating gate has a lower electron trapping rate for an advanced low-voltage flash memory, as shown in FIG. 8. Using the microcrystalline polysilicon with small grain size, a lot of grains exist in the floating gate. There is a reduced trapping rate of the tunnel oxide layer due to small grain size of the floating gate. During programming, electrons can pass through the tunnel oxide layer to the floating gate or the substrate, then improving reliability of the flash memory.

Although specific embodiments have been illustrated and described, it will be obvious to those skilled in the art that various modifications may be made without departing from what is intended to be limited solely by the appended claims.

TABLE 1

| Wafer | Film | Thicks (CV) (Å) | Thicks (FV) (Å) | QBD $C/cm^2$ | TRH e-/billion |
|---|---|---|---|---|---|
| 1 | With | 105.0 | 103.6 | 23.50 | 0.030 |
| 2 | microcrystalline | 104.2 | 103.6 | 23.02 | 0.033 |
| 3 | silicon film | 104.6 | 103.6 | 22.04 | 0.033 |
| 4 |  | 104.6 | 103.6 | 21.66 | 0.027 |
| 11 | With Polysilicon | 104.8 | 103.6 | 13.82 | 0.028 |
| 12 | film | 104.6 | 103.6 | 14.14 | 0.031 |
| 13 |  | 104.6 | 103.6 | 14.74 | 0.031 |
| 14 |  | 104.8 | 103.6 | 14.94 | 0.032 |
| 15 |  | 104.6 | 103.6 | 14.47 | 0.031 |
| 16 |  | 104.4 | 103.6 | 15.12 | 0.035 |
| 17 |  | 104.8 | 103.6 | 16.34 | 0.037 |
| 18 |  | 104.4 | 103.6 | 13.70 | 0.036 |
| 19 |  | 104.8 | 103.6 | 16.10 | 0.036 |
| 20 |  | 104.4 | 103.6 | 16.02 | 0.035 |
| 21 |  | 104.4 | 103.6 | 15.79 | 0.035 |

What is claimed is:

1. A method for forming a floating gate on a gate dielectric layer, said method comprising:

forming a microcrystalline polysilicon layer with a grain size about 500 angstroms to 1000 angstroms on said gate dielectric layer by a low pressure chemical vapor deposition method using silane and a gas stream containing hydrogen gas having a gas ratio not less than 5% under a reaction pressure of 200 torr to 400 torr.

2. The method of claim 1, wherein said low pressure chemical vapor deposition method is performed at a temperature about 700~750° C.

3. The method of claim 1, wherein said gas ratio of hydrogen gas in said gas stream is about 5~60%.

4. The method of claim 3, wherein said gas stream contains hydrogen gas and nitrogen gas.

5. The method of claim 2, wherein said gas ratio of hydrogen gas in said gas stream is about 5~60%.

6. The method of claim 5, wherein said gas stream contains hydrogen gas and nitrogen gas.

* * * * *